US012793932B2

(12) United States Patent
Trimby et al.

(10) Patent No.: US 12,793,932 B2
(45) Date of Patent: Nov. 10, 2026

(54) METHOD AND SYSTEM FOR INDEXING ELECTRON DIFFRACTION PATTERNS

(71) Applicant: Oxford Instruments Nanotechnology Tools Limited, High Wycombe (GB)

(72) Inventors: Patrick Trimby, Abingdon (GB); Klaus Mehnert, Paderborn (DE); Aimo Winkelmann, Paderborn (DE)

(73) Assignee: Oxford Instruments Nanotechnology Tools Limited, High Wycombe (GB)

( * ) Notice: Subject to any disclaimer, the term of this patent is extended or adjusted under 35 U.S.C. 154(b) by 539 days.

(21) Appl. No.: 18/205,711

(22) Filed: Jun. 5, 2023

(65) Prior Publication Data

US 2023/0395350 A1 Dec. 7, 2023

(30) Foreign Application Priority Data

Jun. 6, 2022 (GB) ..................................... 2208289

(51) Int. Cl.
*H01J 37/244* (2006.01)
*G01N 23/20058* (2018.01)
(Continued)

(52) U.S. Cl.
CPC ...... *H01J 37/244* (2013.01); *G01N 23/20058* (2013.01); *G01N 23/2055* (2013.01);
(Continued)

(58) Field of Classification Search
None
See application file for complete search history.

(56) References Cited

U.S. PATENT DOCUMENTS 5,488,476 A * 1/1996 Mansfield ............ G01B 11/303 356/600
5,666,053 A * 9/1997 Suzuki ............... G01R 33/0213 324/261
(Continued)

FOREIGN PATENT DOCUMENTS

CN 108896591 A * 11/2018 ......... G01N 23/2055
CN 110927189 A * 3/2020 ........... G01N 23/203
(Continued)

OTHER PUBLICATIONS

English machine translation for DE-102014100765-A1 (Year: 2015).*
(Continued)

*Primary Examiner* — David E Smith
*Assistant Examiner* — Alina Kaliszewski
(74) *Attorney, Agent, or Firm* — BLANK ROME LLP

(57) ABSTRACT

A method of indexing an electron diffraction pattern comprises obtaining a number of experimental electron diffraction patterns from a sample of material. A master simulation dataset is loaded into the primary memory of a computer system for each phase of the sample material. A simulated template representing a simulated electron diffraction pattern is generated at a first resolution in the primary memory of the computer by using the master simulation dataset. The simulated template is compared with the experimental electron diffraction pattern so as to generate a corresponding similarity measure which is stored. The process is repeated for all crystallographic orientations using crystallographic orientation intervals, and for each phase and each location on the sample. The stored similarity measures are then analysed so as to select at least one resultant indexed phase and orientation for each location. A system configured to perform the method is also provided.

17 Claims, 5 Drawing Sheets

(51) Int. Cl.

| | |
|---|---|
| ***G01N 23/2055*** | (2018.01) |
| ***G06F 16/901*** | (2019.01) |
| ***H01J 37/26*** | (2006.01) |
| ***H01J 37/28*** | (2006.01) |
| ***H01J 37/295*** | (2006.01) |

(52) U.S. Cl.

CPC .......... *G06F 16/901* (2019.01); *H01J 37/265* (2013.01); *H01J 37/28* (2013.01); *H01J 37/2955* (2013.01); *H01J 2237/24475* (2013.01)

(56) References Cited

U.S. PATENT DOCUMENTS

| | | | | |
|---|---|---|---|---|
| 6,326,619 | B1 * | 12/2001 | Michael | G01N 23/203 250/307 |
| 6,835,931 | B2 * | 12/2004 | Wright | G01N 23/203 250/307 |
| 8,253,099 | B2 * | 8/2012 | Nicolopoulos | H01J 37/05 250/311 |
| 10,663,414 | B2 | 5/2020 | Bauer | |
| 10,811,218 | B2 | 10/2020 | Mori et al. | |
| 11,211,222 | B2 * | 12/2021 | Flanagan | H01J 37/244 |
| 11,270,867 | B2 | 3/2022 | Schwager et al. | |
| 2004/0011958 | A1 * | 1/2004 | Wright | G01N 23/203 250/307 |
| 2006/0080040 | A1 * | 4/2006 | Garczarek | H01J 49/0027 702/19 |
| 2006/0126916 | A1 * | 6/2006 | Kokumai | G03F 9/7092 382/151 |
| 2010/0158392 | A1 | 6/2010 | Adams et al. | |
| 2011/0064191 | A1 * | 3/2011 | Toth | G01N 23/20033 378/53 |
| 2011/0144922 | A1 * | 6/2011 | Corbett | G01N 23/2252 702/28 |
| 2011/0220796 | A1 * | 9/2011 | Nicolopoulos | H01J 37/28 250/311 |
| 2015/0168318 | A1 * | 6/2015 | Beckman | H01J 49/0431 250/311 |
| 2015/0369760 | A1 * | 12/2015 | Penman | G01N 23/203 250/307 |
| 2016/0139063 | A1 * | 5/2016 | Taheri | G01N 23/20 250/307 |
| 2017/0309441 | A1 * | 10/2017 | Flanagan, IV | H01J 37/261 |
| 2018/0010909 | A1 * | 1/2018 | Winkelmann | G01N 23/203 |
| 2020/0365365 | A1 * | 11/2020 | Yamamoto | H01J 37/222 |
| 2022/0136985 | A1 * | 5/2022 | Day | G01N 23/203 250/307 |
| 2022/0221412 | A1 * | 7/2022 | Goran | G01N 23/20008 |
| 2022/0317067 | A1 * | 10/2022 | Buijsse | G01N 23/20025 |
| 2023/0280290 | A1 * | 9/2023 | Toraya | G01N 23/2055 378/71 |

FOREIGN PATENT DOCUMENTS

| | | | | | |
|---|---|---|---|---|---|
| DE | 102014100765 | A1 | * | 7/2015 | G06T 7/168 |
| GB | 2338297 | A | * | 12/1999 | H10P 74/00 |
| GB | 2401680 | A | | 11/2004 | |
| JP | 2007057408 | A | * | 3/2007 | |
| JP | 2009098008 | A | * | 5/2009 | |
| WO | 2010052289 | A1 | | 5/2010 | |
| WO | 2014125295 | A1 | | 8/2014 | |
| WO | 2020225234 | A1 | | 11/2020 | |
| WO | WO-2021224622 | A1 | * | 11/2021 | G01N 23/203 |

OTHER PUBLICATIONS

English machine translation for JP-2007057408-A (Year: 2007).*
English machine translation for JP-2009098008-A (Year: 2009).*
English machine translation for CN-108896591-A (Year: 2018).*
English machine translation for CN-110927189-A (Year: 2020).*
International Search Report, mail date Nov. 13, 2023, 2 pages, received in corresponding GB patent application No. GB2308416.3.
Office Action received in corresponding U.S. Appl. No. 18/205,878; mail date Aug. 27, 2025.

* cited by examiner

METHOD AND SYSTEM FOR INDEXING ELECTRON DIFFRACTION PATTERNS

CROSS-REFERENCE TO RELATED APPLICATION

This application claims priority to GB Patent Application Serial No. 2208289.5, filed Jun. 6, 2022, which is hereby incorporated herein by reference in its entirety.

FIELD OF THE INVENTION

The present invention relates to a method and system for indexing electron diffraction patterns.

BACKGROUND

In the materials analysis technique of electron backscatter diffraction (EBSD), an electron beam is focused onto a point on the surface of a sample. An electron detector (for example, a direct electron detector, or an indirect electron detector with a scintillator to convert the electrons to light) is used to collect an image of the resulting diffraction pattern from that point. The electron backscatter diffraction pattern (EBSP) is typically made up of multiple intersecting bands of higher intensity signal, referred to as Kikuchi bands. The relative positions and intensities of the Kikuchi bands are dependent upon the crystal structure, composition and the 3-dimensional orientation of the crystal lattice at the analysis point.

Conventional image processing methods, such as the Hough transform or Radon transform can be used to identify the positions of the Kikuchi bands in EBSPs obtained from materials being analysed. This information, combined with the known geometry of the experimental system, allows angles between the Kikuchi bands to be calculated. These angles are then compared with those in reference structures, allowing the phase and orientation of the point on the sample to be obtained.

In some situations the Kikuchi bands can be very indistinct and are not able to be reliably detected using these conventional image processing methods based on the Hough or Radon transforms. The poor diffraction pattern quality can be caused by: anything breaking the periodicity of the lattice such as a high defect density in the sample's crystalline lattice volume (e.g. as resulting from significant deformation of the material); a low electron dose, resulting in a very low signal to noise ratio in the diffraction pattern; a nanocrystalline structure, resulting in the diffraction pattern originating from a volume that includes multiple crystal lattice orientations or multiple phases; or non-crystalline regions including amorphous material or cracks/voids.

An alternative approach to the detection of Kikuchi bands in EBSPs has been developed in recent years. This alternative approach is based upon the simulation of EBSPs using dynamical pattern simulations which predict not only the Kikuchi bands but also their intensity distribution. These simulated EBSPs are of sufficient accuracy in terms of Kikuchi band intensities and position to allow image correlation techniques to be used to compare these computer generated EBSPs with the experimental EBSPs. This technique is generally referred to as "dictionary indexing". Whereas the Hough transform approach to indexing identifies and extracts features from the EBSPs for comparison with reference information, the dictionary indexing approach is not concerned with feature extraction. With dictionary indexing the material is indexed simply as a result of relying upon a metric of similarity between the experimental image and the computer generated images. This approach, whilst potentially very powerful, requires substantial computational resources in terms of data transmission bandwidth and processing speed. For example, even for a relatively simple cubic crystal with high degrees of symmetry, using a sampling angular interval of between 1 and 2 degrees will still require a dictionary of around 500 000 patterns. Lower crystal symmetries readily require millions of patterns within the dictionary for a similar sampling interval. In today's practical applications the time taken to index EBSPs is of the order or hours and sometimes days.

It can be reasonably expected that the speed of computer processing per unit cost will continue to increase as technology advances. Likewise it is expected that electron detectors will continue to be developed with increasing speed (patterns per second recorded), sensitivity (improved signal to noise ratio) and resolution, this in turn necessitating the use of additional computational resources to process the additional volumes of data present within experimentally obtained EBSPs.

It is an object of the present invention to provide the benefits of the dictionary indexing technique at greatly enhanced indexing speeds using existing computational resources of the kind which may be found in commercially available materials analysis systems such as electron microscope systems.

SUMMARY OF INVENTION

In accordance with a first aspect of the invention there is provided a method of indexing an electron diffraction pattern obtained from a material having one or more crystalline phases, the method comprising:

a) obtaining a number of experimental electron diffraction patterns from a sample of the material, according to a set of experimental conditions in which an electron beam is incident at a number of locations upon the sample and the scattered electrons are monitored by a detector;
b) obtaining a master dataset for each phase of the sample material, each master dataset representing the three dimensional distribution of the electrons scattered from a crystal of the given phase, according to a set of simulation conditions;
c) loading the master dataset into the primary memory of a computer;
d) generating a simulated template at a first resolution in the primary memory of the computer by using the master dataset from the primary memory and geometric calibration data describing the relative positions of at least the location on the sample, the electron beam and the detector, wherein the simulated template represents a simulated electron diffraction pattern for a nominal crystallographic orientation;
e) comparing the simulated template with the experimental electron diffraction pattern so as to generate a corresponding similarity measure;
f) storing the crystallographic orientation and the corresponding similarity measure for the given simulated template;
g) repeating steps d to f for all crystallographic orientations according to one or more crystallographic orientation intervals;
h) repeating steps d to g for each location of the sample;
i) repeating steps c to h for each phase; and, j) analysing the similarity measures stored in step f so as to select at least one resultant indexed phase and orientation for each location.

We provide a new approach for the interrogation and indexing of electron diffraction patterns collected in an electron microscope from a crystalline material. We call this approach "dynamic template matching" (DTM).

The method is applied in the field of electron diffraction, this term being intended to include physical arrangements where the detector and incident electron beam are positioned upon the same side of the sample, namely electron backscatter diffraction (EBSD), as well as the newer techniques of transmission Kikuchi diffraction (TKD) (where the electron beam and the electron detector are on opposing side of the sample) and reflection Kikuchi diffraction (an emerging variant of EBSD where the sample is in a horizontal geometry). The technique is not limited to the scanning electron microscope, as it could be applied to any electron diffraction technique in electron microscopy that results in patterns with characteristic variations in signal intensities resulting from the crystal structure and crystal lattice orientation at the point/volume in the sample from which the diffraction pattern originates. With reference to the terms "crystal" and "crystalline" it should be understood that there is no intention to limit the present invention to materials which can be thought of as only crystalline. Rather the invention is intended to include phases or regions where the material is substantially amorphous. The degree of crystallinity which is needed by the invention is only that which is sufficient to produce Kikuchi bands with enough signal to noise ratio to enable an image analysis software to distinguish between correct (to a degree of confidence) and incorrect patterns and templates embodied as image data.

The invention provides significant performance advantages in terms of the speed at which indexing can be achieved whilst maintaining the accuracy of the resultant indexing, in comparison with the dictionary indexing method. The known dictionary indexing method requires the pre-calculation of all candidate simulated patterns (covering all possible phases and crystal orientations) and their storage in a large library. Once the library has been generated, then, for each measured experimental pattern, the simulated patterns are loaded from the library and are matched against the experimental pattern. We note here that, where reference is made to obtaining an electron diffraction pattern or a master dataset, the obtaining is in the broad sense of getting or locating the appropriate information (typically computer data) for use later in the method. In each case an earlier separate procedure may exist for the acquiring of the experimental electron diffraction pattern using an SEM, or for the generation or calculation of a master dataset.

In this invention, however, the simulated templates are created only when required for the correlation with each experimental diffraction pattern (in the comparing step e) and only at an appropriate resolution so as to use the computational resources efficiently. There is no time-consuming creation and storage of a library of simulated patterns, as is required at the start of each dictionary indexing analysis. Furthermore, the templates are only simulated if they will be used in the method. In contrast, the number of simulated patterns required by the dictionary indexing method will depend on the desired orientation precision and the crystal symmetry of the phase(s). For high symmetry structures (such as cubic crystal symmetry) this would require around 100,000 templates, with a 2° orientation spacing. For a low symmetry structure (such as a monoclinic or triclinic crystal symmetry) more than 1000000 simulated patterns would be required. The typical time period to generate such a library for a single-phase dataset is many hours (e.g. 5-24 hours), although this can be improved by the use of a high performance graphical processing unit (GPU).

A key improvement is the use of the "on-the-fly" generation of the simulated templates which enables only the intended template which is needed at that time to be generated. Whilst it may appear counterintuitive to expend computational resources on the simulation of a template during the analysis, this avoids the loading and unloading of numerous previously simulated patterns into the primary memory of the computer. These may also not be generated for the precise geometrical arrangement used. The creation of the dictionary (i.e. the hundreds of thousands or millions of simulated patterns) will need to be recreated for each experiment, where the geometrical arrangement, phases present or electron beam energy changes. This therefore causes a significant amount of data traffic and processing which the present method avoids. Using the new approach disclosed herein, for each location on the sample, the specific geometrical projection parameters for the diffraction pattern can be used for the creation of the templates (these parameters describe the geometrical relationship between the measurement point and the imaging detector and they will vary from point to point as the electron beam is scanned across the surface of the sample). The geometric calibration parameters which are precisely relevant to the current location can therefore be used in the simulation of the template.

A further advantage deriving from the "on-the-fly" template simulation is that there is not a requirement for any pre-defined orientation precision, unlike the dictionary indexing method where necessarily this is needed for the simulated patterns to be calculated in advance. For a pre-calculated library of templates in dictionary indexing, the templates will have a fixed orientation spacing (for example a 2° orientation difference between each template). In contrast, for the dynamic template matching method, the orientation spacing can be adjusted at any stage of the process, making the analysis more flexible and allowing the indexing of crystals to be arrived at more quickly.

The present dynamic template matching approach is significantly faster than dictionary indexing because of the more efficient use of computational resources, in particular: local generation of templates in memory, the potential use of a minimum level of resolution for the purpose of indexing and the use of only templates that are needed to dismiss crystal orientations that are incorrect or confirm those that are candidates for correct indexing. The process of creating each template, as required, from the master pattern (dataset) is, perhaps counterintuitively, quicker than the process of loading precalculated templates from a directory. We note here that, when generated using simulation techniques (which is usually the case), the master dataset is a master simulation dataset.

A further advantage derived from the on-the-fly nature of the dynamic template matching method is that each experimental diffraction pattern and simulated template can be dynamically adjusted to remove or lessen the effect of image artefacts, such as shadowed regions, blemishes on the detector or pattern margins with a significantly lower signal to noise ratio.

These advantages result in a significant improvement in the usability, speed and performance of this new indexing approach. The benefits of pattern matching over conventional Hough transform based indexing are well established, but the dynamic template matching method gives access to these benefits in a much shorter time.

The method is presented as a number of steps. It is not intended that these steps must be performed only in the alphabetical order in which they are listed. For example the master dataset (step b) may be obtained before the experimental diffraction patterns (step a). Furthermore, reference to an earlier step in the method should not imply that the earlier step is performed immediately before the current step in a step sequence, although it may be. Where groups of steps are said to be repeated, these need not exclude intervening steps. For example, whilst calculations relating to all phases in a multiphase material may be performed for a given location on the sample before moving on to the next location, it is also possible that orientations are calculated for all locations for a single phase before all such locations are then considered for another phase.

In order to maximise the efficient use of the primary computer memory during step d, the simulated templates may only be generated whilst the master dataset is present within the primary memory of the computer. Thus the primary memory of the computer may hold only one simulated template at any time.

References to primary memory herein are to the memory in a computer system which may be accessed directly by the computer processor(s). It may also be thought of as the main memory of the computer. Primary memory typically uses types of RAM although may also include types of ROM. In a physical desktop or laptop system the primary memory is held on the device itself. This may be contrasted with secondary memory which is typically non-volatile, of larger capacity and used for permanent storage of data. The access speed of secondary memory is significantly slower than that of primary memory. In physical devices such secondary memory may be provided in a separate device or even remotely via a network. For the avoidance of doubt, the present invention is not limited to use of physical devices and may be effected via cloud computing.

In order to use the primary memory efficiently it is preferred that the simulated templates are not retained in the computer for longer than is needed. Typically, the simulated templates are discarded from the primary memory before step g.

The speed of the process is enhanced by the use of larger crystallographic orientation intervals. Of course the larger the interval the greater the chance of the true crystal orientation being not identified or being incorrectly identified. The crystallographic orientation interval used on each crystallographic rotation axis is preferably in the range 1 to 3 degrees, in order to balance these competing requirements. It will be further understood that the number of simulated templates needed to be generated not only depends upon the crystallographic orientation interval but also upon the inherent symmetry within the crystal. Thus, the method being repeated for all crystallographic orientations may include these intervals being representative of the range of all possible directions. Further, the crystallographic orientations investigated may not include those which are directly related by crystal symmetry.

The use of a crystallographic orientation interval within the calculations will normally introduce a degree of imprecision in the initial indexing result. Indeed, there may also be more than one indexing result which is deemed to be a reasonable solution. The precision of the indexing may be improved by a refinement process once an initial indexing solution has been achieved.

Following the selection of a resultant indexed phase for a location, the method may further comprise:

i) obtaining the experimental electron diffraction pattern used in step a at a second resolution;
ii) generating second simulated templates at the second resolution using the master dataset based upon the selected indexed phase, wherein the second simulated templates represent simulated electron diffraction patterns for crystallographic orientations corresponding to that of the indexed phase and which are modified at one or more crystallographic orientation sub-intervals which are smaller than the intervals in step f;
iii) comparing the second simulated templates with the experimental electron diffraction pattern so as to generate a corresponding similarity measure; and,
iv) analysing the similarity measures relating to the second simulated templates so as to select at least one resultant indexed phase and orientation for the location which has an improved similarity measure in comparison with that obtained using the simulated templates.

The above steps are described generically rather than in the sense that a strict sequence is followed, not least since they are normally iterative processes. The refinement process may be achieved by a number of approaches such as following the Nelder-Mead or Downhill Simplex methods. These allow the orientation solution space to be investigated and a more accurate indexing result to be achieved. Whilst these methods require computational resources, these are used efficiently since an approximate solution is used as the starting point for the indexing refinement. A few hundred templates may be generated during such a refinement process.

Typically the experimental electron diffraction patterns are provided at the first resolution which is that at which the simulated templates are generated. In practice this allows any comparison between the experimental electron diffraction patterns and the templates to be made readily. Although the second resolution may be the same as the first resolution, typically the second resolution is greater than the first resolution, as this provides greater accuracy of the data. The resolutions used in the method may be selected depending upon the application. Whilst the method does not require the display of an image in order to be performed, the resolutions referred to herein may be thought of as image resolutions. A resolution may therefore be expressed in terms of the number of pixels along the dimensions of the image in question. Typically the first resolution is selected to be a compromise between a low resolution (which requires fewer calculations by the computer processor), and having a sufficient range of possible data to allow different orientations to be calculated which enable an orientation of a given desired accuracy to be outputted. Typically, the first resolution is lower than a native resolution at which the experimental electron diffraction pattern was originally produced by the detector. The second resolution may be a resolution which is the same as the native resolution, or may be a resolution which is intermediate between the first resolution (lower) and the native resolution. The method may therefore include converting the experimental diffraction patterns to the first resolution prior to step d. Typically for comparison purposes the simulated templates and the experimental diffraction patterns are at the same resolution when being compared. Generally the resolutions may be described as an xy array of pixels with x and y each representing a number of pixels. For the simulated templates in step d, typically each of x and y is smaller than 50. For example the detector resolution at which the experimental diffraction patterns are originally recorded may have pixels in the x and y dimensions in excess of 100. The diffraction patterns may therefore be provided at a detector resolution which is at least 2 times greater than that of the simulated templates in step d. The method can create and match templates much faster when they are at a lower resolution (which are matched to the binned/downsized experimental patterns). Higher resolutions may be used selectively when performing a refinement process in order to provide greater precision in the final result.

An additional benefit of using low resolutions is that, for very poor patterns, the method provides better matching when working with lower resolutions (the Kikuchi bands may be blurred and thus a lower pixel resolution will improve the match and the NCCC value).

In order to obtain information from an area of interest on the surface of the sample a plurality of locations are arranged on the sample surface in an array. Experimental diffraction patterns are typically obtained from each location. It will be understood that the number and relative positions of the locations can be freely modified according to the circumstances and application (including different spacings, different array parameters and indeed irregular positioning without the use of an array). This also includes the use of a single location, rather than a plurality of locations.

It is important to use a similarity measure which is appropriate for the analysis of data representing images and therefore preferably the similarity measure is an image correlation measure. It has been found that using a normalised cross correlation coefficient, NCCC is beneficial for this particular purpose. Another similarity measure which could be used is the "normalised inner product" (also called the "normalised dot product") although this is less effective as it is influenced by the image intensity and mean levels.

Once the material present at each location has been indexed using the method, the information derived may then be subjected to further analysis including outputting in a given form, such as using a computer display. The method may therefore further comprise displaying information relating to one or more of the phase identity and orientation of the crystal at the or each location.

In accordance with a second aspect of the invention there is provided a system for indexing an electron diffraction pattern obtained from a material having one or more crystalline phases, the system comprising a computer system including a central processing unit having a primary memory, wherein the system is configured when in use to perform the method according to the first aspect of the invention. The system may further comprise an electron detector configured to receive electrons scattered from a sample as a result of an electron beam interacting with the sample and to generate data representing the detected scattered electrons for analysis. In such a case the computer system and electron detector may be provided by a common vendor.

In accordance with a third aspect of the invention there is provided a computer program product comprising instructions which, when the program is executed by a computer, such as the computer system of the second aspect of the invention, cause the computer to carry out the method of the first aspect of the invention.

In accordance with a fourth aspect of the invention there is provided an apparatus for indexing an electron diffraction pattern obtained from a material having one or more crystalline phases, the apparatus comprising:

an electron beam system, including a number of lenses for directing an electron beam, when in use, onto the surface of a sample, wherein the electron beam interacts with the sample and electrons are scattered from the sample; and, a computer system configured to operate the system and to analyse data representing the scattered electrons, the computer system including a central processing unit having a primary memory;

wherein the system is configured when in use to perform the method according to the first aspect of the invention.

The apparatus may further comprise a sample holder for holding the sample to be analysed; and an electron detector configured to receive the electrons scattered from the sample as a result of the electron beam interacting with the sample and to generate the data representing the detected scattered electrons for analysis. Each of the sample holder and the electron detector may be a specialised apparatus selectable by a user of the system and obtained from a respective third party vendor according to the application in question. It will be understood that the system of the second aspect of the invention may be used as part of the apparatus according to the fourth aspect of the invention. The apparatus according to the fourth aspect of the invention may be an electron microscope.

BRIEF DESCRIPTION OF DRAWINGS

We now describe a system and method with reference to the accompanying drawings, in which.

DETAILED DESCRIPTION

Figure 1:
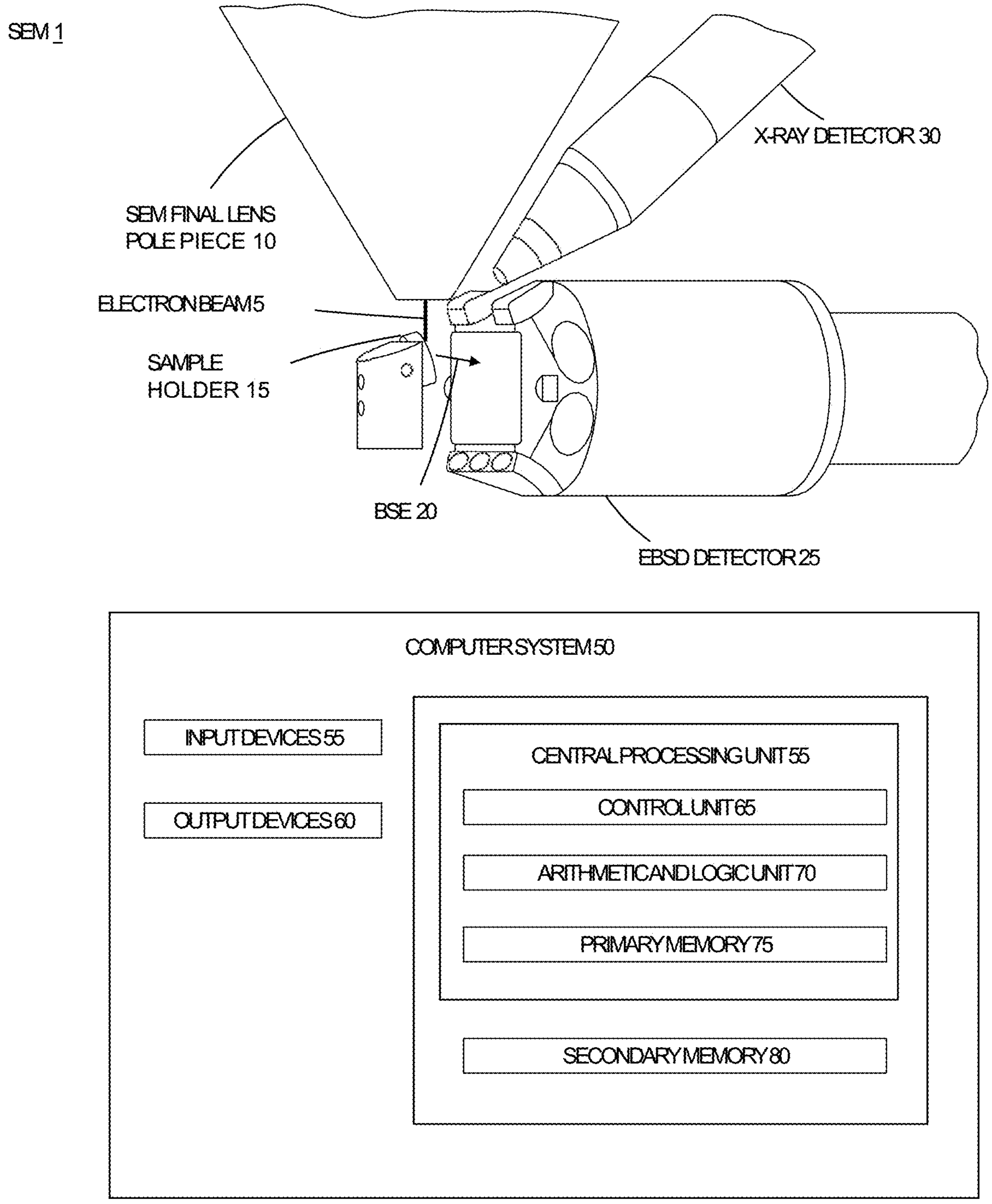
FIG. 1 is a schematic illustration of part of the vacuum chamber of a scanning electron microscope which includes a computer system.

With reference to the accompanying drawings, FIG. 1 is a schematic representation showing some parts of a system that are employed in a scanning electron microscope (SEM) 1 for analysing a sample of material. The SEM electron beam 5 is produced inside an evacuated chamber and usually focussed with a combination of magnetic lenses forming the "SEM column", the final part of which, the SEM final lens pole piece 10 is shown in FIG. 1. When the focussed beam 5 strikes a sample held in a sample holder 15, some electrons are scattered back from the specimen (backscattered electrons or BSE in this embodiment) or interact with the specimen to produce secondary electrons (SE) and a number of other emissions such as X-rays. Kikuchi band patterns are caused by diffraction of the emerging backscattered electrons. The backscattered electrons BSE 20 are detected by an EBSD detector 25. A separate x-ray detector 30 is used to detect the x-rays for analysis.

An alternative geometry configuration uses a thin sample that is supported so that the focussed electron beam is transmitted through the sample and the detector is placed below the sample so that electrons scattered from beneath the sample strike the detector which is used to form an image that contains a "transmitted electron Kikuchi pattern" or TKD pattern.

The SEM 1 includes a computer system 50 which is used to operate the microscope, including receiving data from the EBSD detector 25. The computer system 50 takes a conventional form having input devices 55 such as a keyboard and mouse, and output devices 60 such as a display and printer. The computer system 50 has a central processing unit CPU 55. The CPU 55 includes a control unit 65 which controls the operation of the system 50 including its component parts. The CPU 55 includes an arithmetic and logic unit 70 which performs the majority of the processing underlying the method to be described. The CPU 55 also includes primary memory 75 in the form of RAM. External to the CPU 55 there is provided secondary memory 80 arranged as a solid state hard disc which has a much larger memory capacity than the primary memory 75. The secondary memory 80 is provided as a non-volatile memory. The control unit 65 may cause data from the secondary memory 80 to be loaded into the arithmetic and logic unit 70, although in order for this to be achieved it must be firstly loaded into the primary memory 75.

In this embodiment electron backscatter diffraction patterns are analysed from a steel sample using the SEM 1. The steel sample is known to comprise two principal phases: austenite (which has a face centred cubic structure) and ferrite (which has a body centred cubic structure). The sample is prepared for analysis using standard metallurgical techniques and is then loaded into the chamber of the SEM 1.

Figure 2:
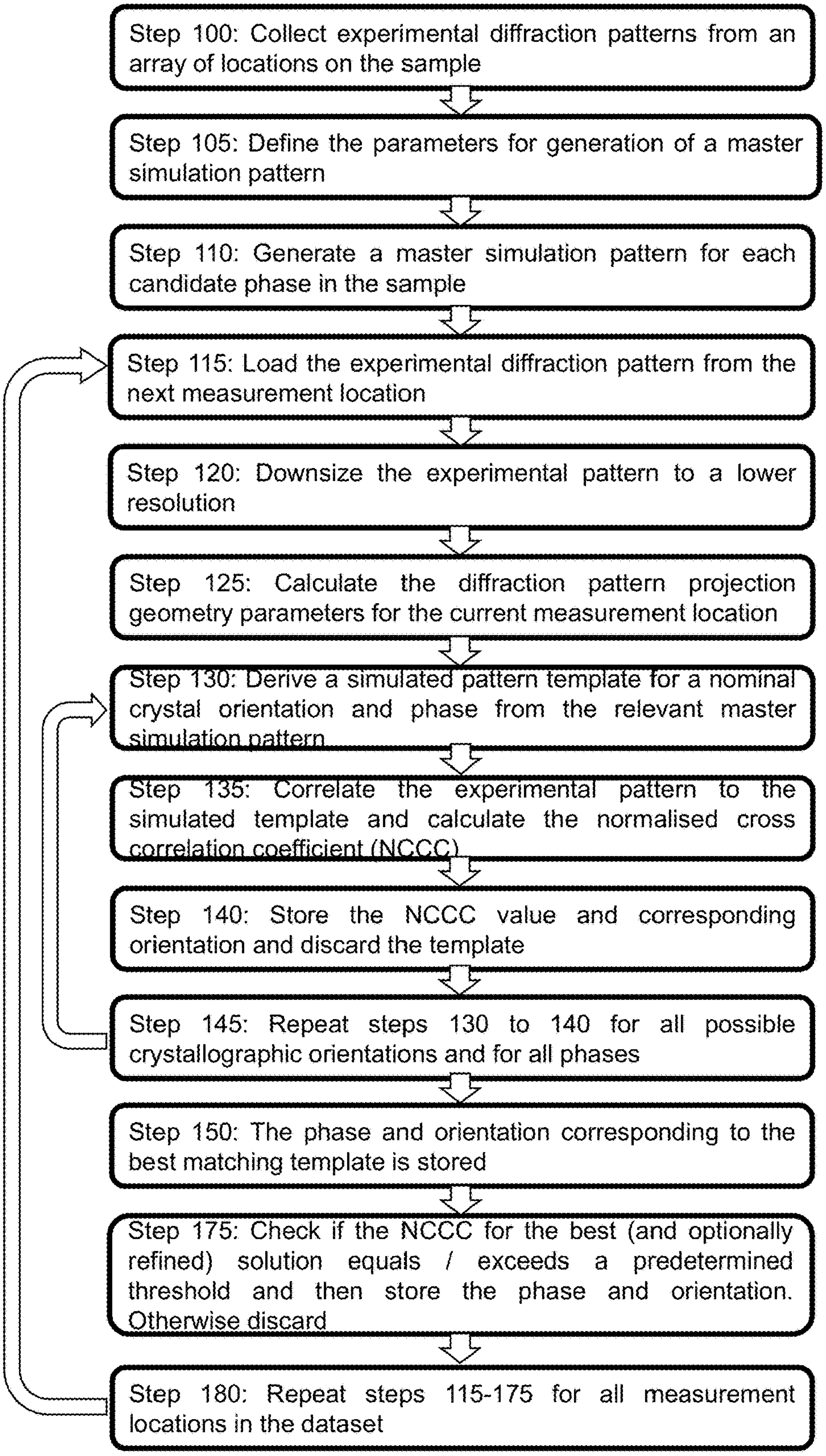
FIG. 2 is a flow diagram of a method according to an embodiment.

Reference is now made to FIG. 2 which shows a summary of the steps of the method now described.

At step 100 the electron beam 5 is caused to be incident on the surface of the sample at each location of a 100 by 100 square grid array, with the distance between the locations being 1 micrometre. An electron backscatter diffraction (EBSD) pattern is generated at each location due to the interaction between the electron beam 5 and the sample material, and this is detected by the EBSD detector 25 forming part of the SEM 1. The EBSD pattern is stored by the computer system 50 in the primary memory 75 forming part of the microscope system, together with the position of the relevant location on the sample and the relative positions of the electron beam, sample and the EBSD detector.

The purpose of the use of an array of locations is to provide EBSD analysis information from an area of the sample, for example to provide information including one or more of the size, orientation, distribution and relative quantities of the phases within the steel sample.

At step 105, the parameters are defined which are needed for the calculation, in step 110, of simulated master diffraction patterns for the two known phases in the sample. Thus in this case there are two known "candidate phases" in the dataset which is to be generated, here these being the ferrite and austenite phases. The input parameters are the phase crystallography (space group and unit cell parameters), the atomic coordinates, the atom types and their occupancy at each atomic site, the electron beam energy, the minimum desired diffracted reflector intensity, the minimum lattice plane spacing, the Debye-Waller factor and the master simulation resolution. The phase atomic and crystallography data are usually included in a standard crystallography information file (*.cif format) and therefore can be readily obtained from such a file.

Figure 3:
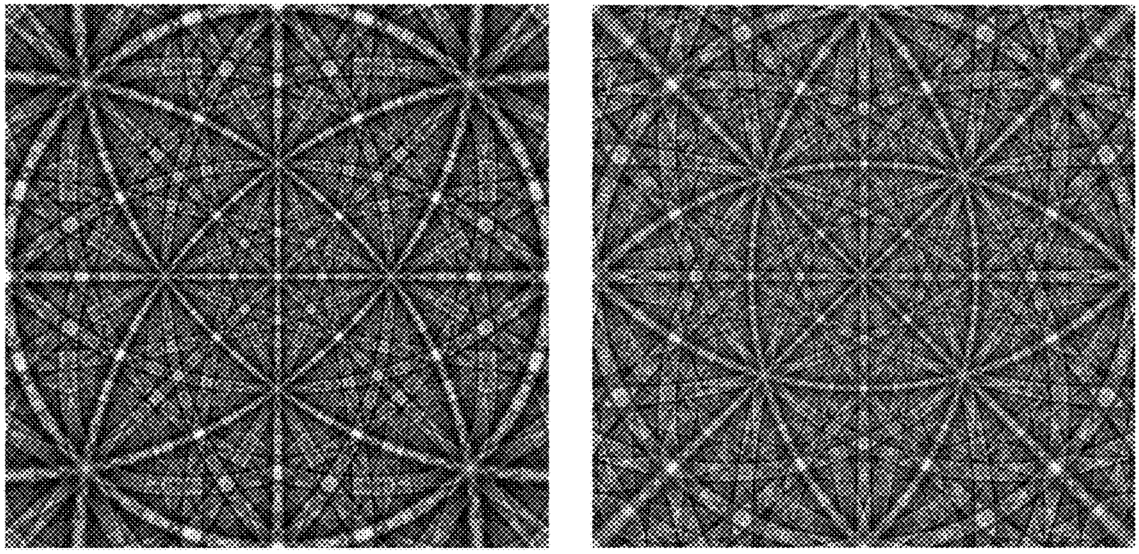
FIG. 3 shows examples of master simulation datasets for two different phases.

At step 110, a simulated master diffraction pattern in the form of a master simulation file is generated using the computer system 50 for each of the phases (ferrite and austenite), using the parameters defined in step 105. The computer system 50 used for this purpose is that used to control the microscope, although a separate computer system could be used instead. The master simulation file includes the predicted diffraction intensities for all crystal directions and is stored in the primary memory 75 of the computer system 50 for subsequent reference. The master simulation can be generated using full dynamical, 2-beam dynamical or kinematical models as desired. Alternatively, it could be derived from experimentally collected diffraction patterns. FIG. 3 shows examples of master simulation files, generated using dynamical simulations with a beam energy of 20 kV, for austenite (left) and ferrite (right).

The method then proceeds by analysing the experimental EBSD pattern at each location in the grid in turn, according to the following series of steps performed for each location.

At step 115 the "next" location in the grid of measurements (for example, starting at location x=1, y=1, referring to position in the grid) the experimentally collected EBSD pattern (from step 100) is loaded by the software running on the computer system to become the current location for processing by the software. This EBSD pattern may be at the native detector resolution, although for the sake of data storage and transfer, it can be that the images in the original detector resolution are downsized ("binned") to a smaller resolution prior to the start of this pattern matching process.

At step 120 the experimental EBSD pattern from step 115 is downsized to a lower resolution, in this case about 40×30 pixels. In the following steps simulated "template" EBDS patterns of the same low resolution will be calculated and compared with this experimental pattern.

At step 125, the relative geometry of the measurement location on the sample surface with respect to the detector 25 is defined. This is typically expressed as the position of the EBSD pattern centre on the detector (the pattern centre being defined as the point on the detector that is closest to the electron beam—sample interaction point, i.e. the "current location" which is the origin of the diffraction pattern) and the detector distance (the distance from the detector to the electron beam—sample interaction point). These geometry calibration values are calculated from the detector calibration values taking into account the focal plane of the electron beam ("working distance") and the detector insertion distance in the chamber of the SEM 1. It should be noted that the standard measurement of the pattern centre and detector distance is typically not very accurate, and so these values are usually refined prior to the pattern matching process.

At step 130, using the simulated master diffraction pattern of a first of the known phases (austenite or ferrite) held in the master simulation file within the primary memory 75, a simulated diffraction pattern template is derived for a nominal crystallographic orientation, using the geometry calibration values for the relevant location (from step 125 above) and at the same resolution as the downsized experimental diffraction pattern (e.g. approximately 40×30 pixels). Referring again to FIG. 3, the nominal crystallographic orientation used relates to a nominal small part of the pattern shown in FIG. 3.

At step 135 the simulated template is then correlated to the experimental pattern within the primary memory 75. The similarity between the two images is calculated, for example using the normalised cross correlation coefficient (NCCC)

technique. This gives a value between 0 (images are completely different) and 1 (images are identical, or an inverse of each other).

At step 140, the NCCC value and corresponding crystallographic orientation (for which the template has been simulated) are stored in the primary memory 75. Notably the template is discarded from the primary memory 75 as this frees up space for the next template and ensures the method does not require large amounts of memory to be occupied by the large number of templates which are generated as the method progresses.

At step 145, the above steps 130 to 140 are repeated for all possible crystallographic orientations of the phase in question, at a predefined orientation spacing (typically 2°). Quaternions may be used as a method of representing the orientations so as to allow their systematic variation. This is performed for all candidate phases, for which in the present example there are two (austenite and ferrite). The resulting data therefore includes the NCCC values for all possible orientations (at the predefined orientation spacing) and for all phases. The present step could therefore be divided into two steps, for example firstly in which all possibly orientations are explored for a current phase, and then doing the same for the next phase until all phases had been investigated.

Figure 4:
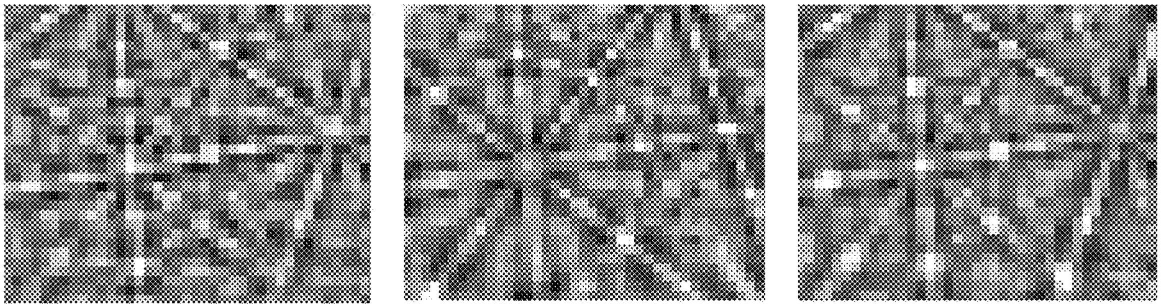
FIG. 4 shows an experimental EBSP (left) and simulated templates austenite (centre) and ferrite (right)

With reference to FIG. 4, there is shown an example experimental diffraction pattern from an austenite crystal (left), downsized to 39×32 pixels, with the best fitting simulated template for ferrite (centre—with NCCC=0.34) and for austenite (right—with NCCC=0.81).

At step 150 the phase and orientation corresponding to the template that matches the experimental pattern with the highest NCCC value is then stored in the primary memory 75.

Figure 5:
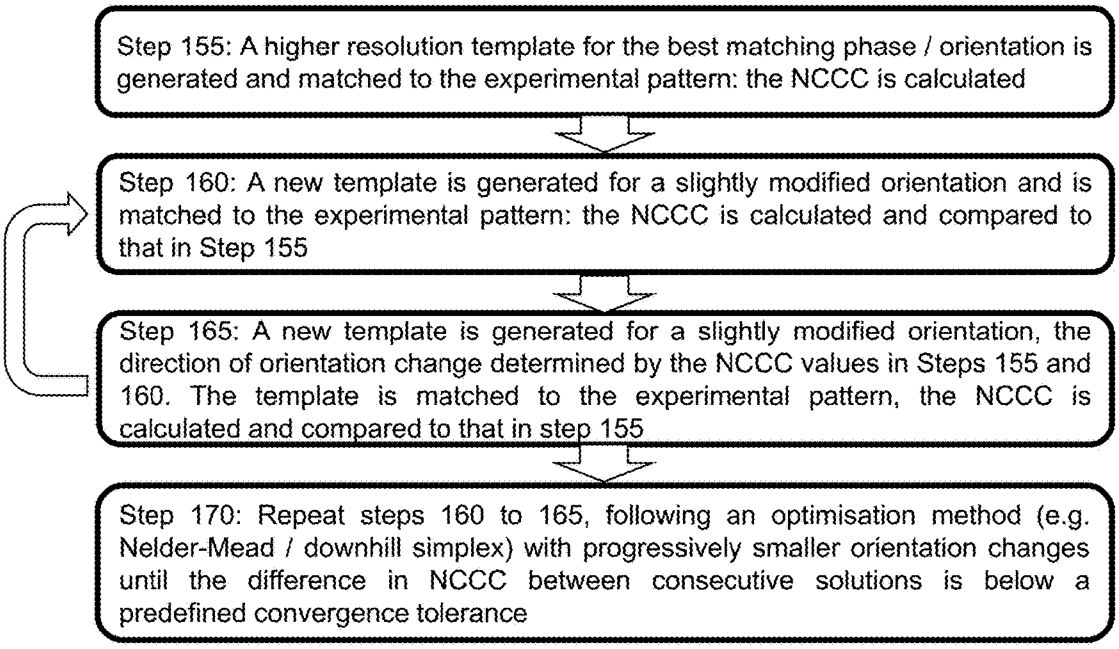
FIG. 5 shows a method of refining the indexing result.

Depending upon the application in question, including considerations such as the number of phases, crystal systems of those phases and the orientation spacing used, it may be beneficial to perform an optional series of steps to refine the best fitting template. Such optional refinement steps are now described in steps 155 to 170 below, and in association with FIG. 5.

At step 155 the template which provided the best match (from step 150) with the experimental pattern is now used as an initial template for refinement, such refinement including the generation of a number of further templates with slightly modified orientations. Using the orientation corresponding to the best matching template, a higher resolution template for that orientation is then calculated, again using the master simulation pattern held in the computer primary memory 75. The resolution chosen for this simulated higher resolution "image" of the template, and other templates involved in the refinement process, may use the same native resolution of the original experimental diffraction pattern (which is dependent upon the EBSD detector 25), although an intermediate resolution between this and the low resolution used in step 130 is also possible. It will be understood that higher resolutions allow greater precision of the data. The NCCC value is calculated using the new higher resolution image for the template, in this case the comparison being with the experimental diffraction pattern at its native resolution, rather than at the lower resolution generated by step 120. Again, the template is discarded from the primary memory 75.

At step 160, a new template is generated for a slightly modified crystallographic orientation and is matched to the experimental pattern at the new resolution and the corresponding NCCC value is calculated. The modification of the crystallographic orientation is less than the predefined orientation spacing (2°) of step 145. A typical orientation step change would be in the range of 1 mrad, which is about 0.005°. A number of different approaches can be used to decide upon how the orientation is modified as are discussed further below. The NCCC value is compared to that measured in the previous step to determine whether the match has improved or worsened. The template is then discarded from the primary memory 75.

At step 165 a new template is generated for a further slightly modified crystallographic orientation, where the direction of crystallographic rotation is determined by the change in NCCC value in step 160 and according to the overall approach being used to improve the NCCC value. The new template is matched to the experimental pattern and a new NCCC value calculated. The template is again discarded from the primary memory 75.

Figure 6:
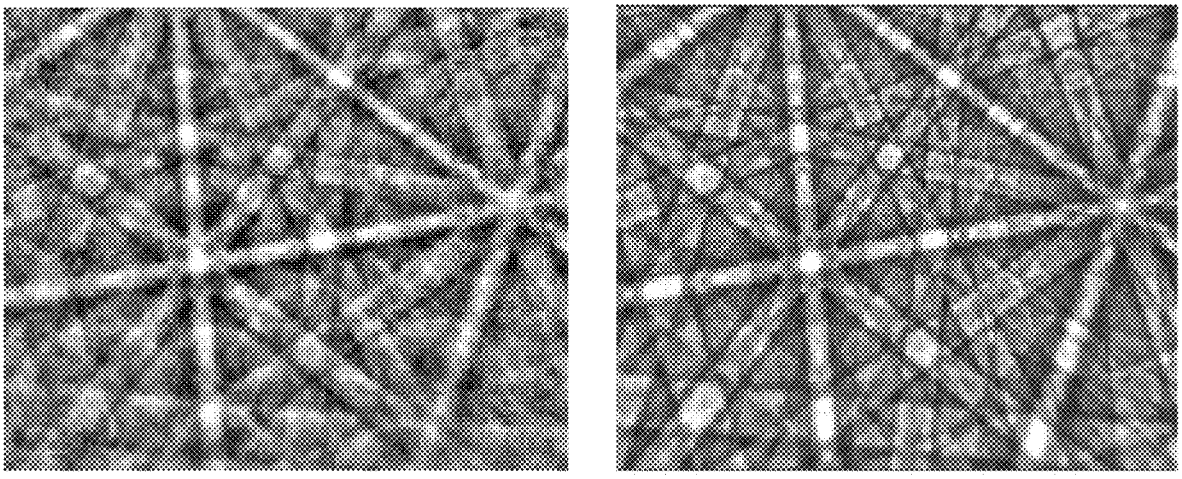
FIG. 6 shows an experimental EBSD (left) with corresponding refined simulated template (right); and, FIG. 7 shows the results of indexing a nanocrystalline sample using a Hough-transform method (left) and the method of the embodiment (right).

At step 170 steps 160 and 165 are repeated, using the chosen optimisation approach (e.g. Nelder-Mead or Downhill Simplex) to find the crystallographic orientation that gives the highest NCCC value. In the Nelder-Mead method for example, the orientation parameter angles are each modified individually to generate each template, in a first stage, and then combinations of these are considered in a later stage. The orientation changes are made progressively smaller between each new template until the change in NCCC between successive solutions is below a predetermined threshold, e.g. 0.0005. FIG. 6 shows an example experimental diffraction pattern from an austenite crystal (left) at the native 156×128 pixel resolution, with the corresponding simulated template (right) following the orientation refinement process. The increase in resolution is notable in comparison with that shown in FIG. 4.

At step 175, returning to the method of FIG. 2, the NCCC of the final solution (best matching phase and orientation) is compared with a predefined threshold (e.g. NCCC=0.15). If the NCCC value equals or exceeds this threshold, then the phase and orientation values are assigned to the measurement location of the grid and then stored to the primary memory 75. If the NCCC is below the threshold, then the results are discarded and the measurement is designated as "not indexed".

At step 180, having achieved an indexed or non-indexed solution for the first location in the grid array, steps 115 to 174 are then repeated for each measurement location in the 100×100 grid of measurements on the sample surface.

Once an indexed or non-indexed solution has been produced for each of the locations, this data may then be used in later analysis or display steps depending upon the particular application. For example the analysis software running on the computer system 50 may process the information further so as to assign a colour scheme to the phases for the purposes of displaying to a user. Another approach might be to provide further analysis in order to provide the user with information concerning the crystallographic texture of the sample. The orientation and phase data determined for each of the locations may also be used to calculate grain sizes, to quantify the extent of plastic deformation in the sample or to calculate the crystallographic properties of boundaries, all of which will influence the bulk physical properties of the material.

The principal benefit of this new approach of dynamic template matching is one of speed. As an example, the reanalysis of an experimentally obtained dataset with a single, cubic phase using dictionary indexing has been reported to take approximately 1 second to initially index and refine the data for each location on the sample, on top of the time taken to generate the library of simulated templates at different orientations, initially. With the dynamic template matching method, using a comparable computing system, approximately 45 locations per second can be indexed and no time is required for an initial orientation dependent library of patterns to be created.

Figure 7:
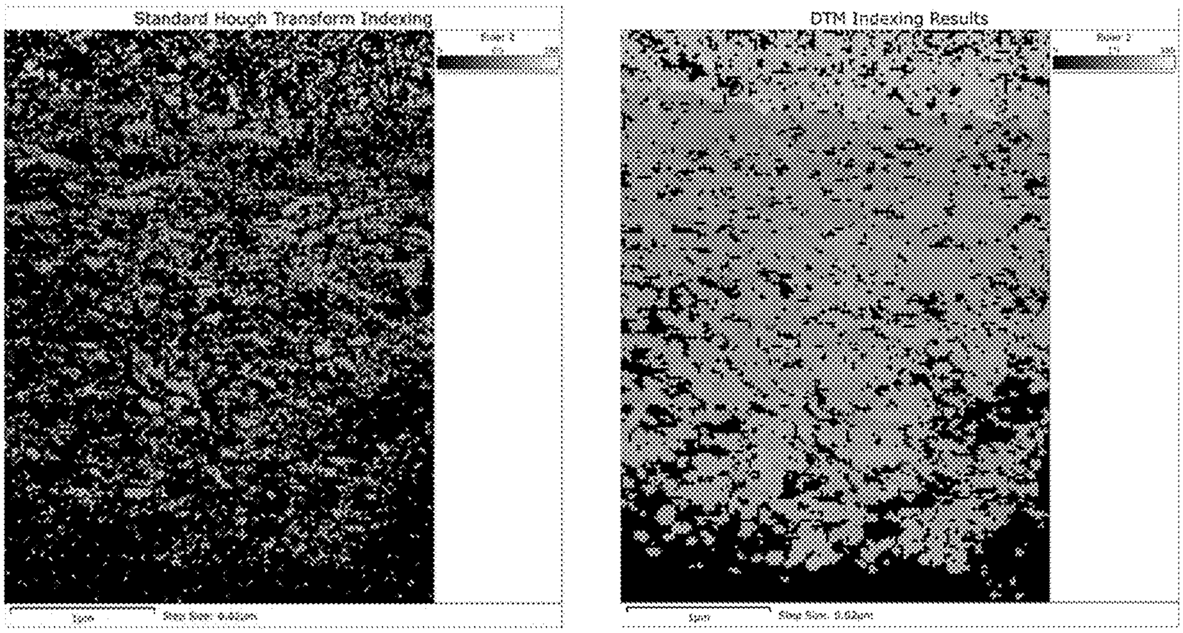

In order to further illustrate the practical use of this dynamic template matching method, an analysis was performed of experimental EBSPs from nanocrystalline hydroxyapatite crystals in human tooth enamel. The small size of the grains in this material, coupled with significant amounts of crystal defects, results in very poor diffraction pattern quality and thus poor results using conventional Hough-transform based indexing. Referring now to FIG. 7, the left-hand image in the figure shows an orientation map collected using Hough-transform indexing, with only 29% of patterns indexed (black areas indicate non-indexed locations). The patterns were then reanalysed using dynamic template matching, with 72% indexing as shown on the right-hand image. The full reanalysis took 70 minutes (including master simulation pattern creation and orientation refinement), whereas the dictionary indexing method using the same hardware would likely take in excess of 24 hours (plus the time to create the library of templates).

The invention claimed is:

1. A method of indexing an electron diffraction pattern obtained from a material having one or more crystalline phases, the method comprising:

a) obtaining a number of experimental electron diffraction patterns from a sample of the material, according to a set of experimental conditions in which an electron beam is incident at a number of locations upon the sample and electrons scattered from the sample are monitored by a detector;

b) obtaining a master dataset for each phase of the sample of the material, each master dataset representing the three dimensional distribution of the electrons scattered from a crystal of the given phase, according to a set of simulation conditions;

c) loading the master dataset into the primary memory of a computer;

d) generating a simulated template at a first resolution in the primary memory of the computer by using the master dataset from the primary memory and geometric calibration data describing the relative positions of at least the location on the sample, the electron beam and the detector, wherein the simulated template represents a simulated electron diffraction pattern for a nominal crystallographic orientation;

e) comparing the simulated template with the experimental electron diffraction pattern so as to generate a corresponding similarity measure;

f) storing the crystallographic orientation and the corresponding similarity measure for the given simulated template;

g) repeating steps d to f for all crystallographic orientations according to one or more crystallographic orientation intervals;

h) repeating steps d to g for each location of the sample;

i) repeating steps c to h for each phase; and, j) analysing the similarity measures stored in step f so as to select at least one resultant indexed phase and orientation for each location.

2. The method according to claim 1, wherein, during step d, the simulated templates are only generated whilst the master dataset is present within the primary memory of the computer.

3. The method according to claim 1, wherein the simulated templates are discarded from the primary memory before step g.

4. The method according to claim 1, wherein step h is repeated more than 100000 times.

5. The method according to claim 1, wherein the crystallographic orientation interval used is in the range 1 to 3 degrees.

6. The method according to claim 1, wherein, following the selection of a resultant indexed phase for a location, the method further comprises:

i) obtaining the experimental electron diffraction pattern used in step a at a second resolution;

ii) generating second simulated templates at the second resolution using the master dataset based upon the selected indexed phase, wherein the second simulated templates represent simulated electron diffraction patterns for crystallographic orientations corresponding to that of the indexed phase and which are modified at one or more crystallographic orientation sub-intervals which are smaller than the intervals in step g;

iii) comparing the second simulated templates with the experimental electron diffraction pattern obtained at a second resolution so as to generate a corresponding similarity measure; and, iv) analysing the similarity measures relating to the second simulated templates so as to select at least one resultant indexed phase and orientation for the location which has an improved similarity measure in comparison with that obtained using the simulated templates generated in step d.

7. The method according to claim 6, wherein step (ii) is performed using the Nelder-Mead or Downhill Simplex methods.

8. The method according to claim 1, wherein the first resolution is lower than a native resolution at which the experimental electron diffraction pattern was originally produced by the detector.

9. The method according to claim 1, further comprising converting the experimental diffraction patterns to the first resolution prior to step d.

10. The method according to claim 1, wherein the simulated templates generated in step d have a resolution of fewer than 50 pixels for each dimension.

11. The method according to claim 1, wherein a plurality of locations are arranged on the sample surface in an array.

12. The method according to claim 1, wherein the similarity measure is an image correlation measure.

13. The method according to claim 12, wherein the image correlation measure is a normalised cross correlation coefficient, NCCC.

14. The method according to claim 1, further comprising displaying information relating to one or more of the phase identity and orientation of the crystal at the or each location.

15. A system for indexing an electron diffraction pattern obtained from a material having one or more crystalline phases, the system comprising:

a computer system including a central processing unit having a primary memory, wherein the system is configured when in use to perform the method according to claim 1.

16. The system according to claim 15, further comprising:

an electron detector configured to receive electrons scattered from a sample as a result of an electron beam interacting with the sample and to generate data representing the detected scattered electrons for analysis.

17. A computer program product comprising instructions which, when the instructions are executed by a computer, cause the computer to carry out the method of claim 1.

* * * * *